United States Patent [19]

Shacham et al.

[11] Patent Number: 4,845,045

[45] Date of Patent: Jul. 4, 1989

[54] METHOD OF FABRICATING ELECTRICALLY-PROGRAMMABLE ELEMENT IN A SEMICONDUCTOR INTEGRATED CIRCUIT USING A DOPED PLUG TO EXTEND THE DEPTH OF A DOPED REGION

[75] Inventors: Yosef Y. Shacham, Haifa, Israel; Alexander B. Sinar, Cupertino; Eric R. Sirkin, Palo Alto, both of Calif.; Ilan A. Blech, Sunnyvale, Calif.

[73] Assignee: Zoran Corporation, Santa Clara, Calif.

[21] Appl. No.: 245,115

[22] Filed: Sep. 15, 1988

[51] Int. Cl.⁴ ............................................. H01L 21/265
[52] U.S. Cl. ..................................... 437/030; 437/048; 365/100; 365/103
[58] Field of Search ............... 437/20, 27, 30, 48, 437/52, 932; 357/51; 365/100, 103

[56] References Cited

U.S. PATENT DOCUMENTS

| | | | |
|---|---|---|---|
| 4,569,120 | 2/1986 | Stacy et al. | 437/24 |
| 4,590,589 | 5/1986 | Gerzberg | 365/100 |

Primary Examiner—Olik Chaudhuri
Attorney, Agent, or Firm—Flehr, Hohbach, Test, Albritton & Herbert

[57] ABSTRACT

An electrically programmable element is fabricated in a P-N junction isolated region of a semiconductor body by first extending the depth of the region in the body by introducing dopants through the region into the body by ion implantation or by diffusion and drive-in, and thereafter forming an amorphotized layer in the first region overlying the extended portion. The increased depth of the first region provided by the second region prevents damage to the P-N junction between the semiconductor body and the first region during formation of the amorphotized layer.

5 Claims, 2 Drawing Sheets

METHOD OF FABRICATING ELECTRICALLY-PROGRAMMABLE ELEMENT IN A SEMICONDUCTOR INTEGRATED CIRCUIT USING A DOPED PLUG TO EXTEND THE DEPTH OF A DOPED REGION

BACKGROUND OF THE INVENTION

This invention relates generally to semiconductor processing technology, and more particularly the invention relates to a method of fabricating electrically-programmable elements in a semiconductor integrated circuit.

Disclosed in U.S. Pat. No. 4,590,589 is an electrically-programmable element in which a surface layer of a doped semiconductor region is amorphotized by ion implantation to thereby increase the resistance of the surface layer. The resistance can be significantly reduced by applying a sufficient programming voltage to the surface layer and thereby crystallize the amorphous structure of the surface layer.

Some semiconductor integrated circuits rely on junction isolation to electrically isolate circuit components in the circuit. In such devices, a region of one conductivity type is formed in a semiconductor body of opposite conductivity type, and the junction therebetween is reverse-biased to electrically isolate the doped region. As integrated circuit dimensions become smaller, the vertical depth of the doped regions becomes smaller. Then in forming an amorphotized surface layer on the doped region, the crystal damage induced by the amorphotizing implant can propagate to the underlying P-N junction and result in unwanted current leakage when the junction is reverse-biased.

SUMMARY OF THE INVENTION

Accordingly, an object of the present invention is a method of fabricating voltage-programmable elements in shallow doped regions in a semiconductor body.

A feature of the invention is the use of a doped plug to extend the depth of a doped region and thereby accommodate an amorphotizing implant without damaging a P-N junction associated with the doped region.

The invention and objects and features thereof will be more fully understood from the following detailed description and appended claims when taken with the drawing.

DETAILED DESCRIPTION OF ILLUSTRATIVE EMBODIMENTS

Figure 1A:
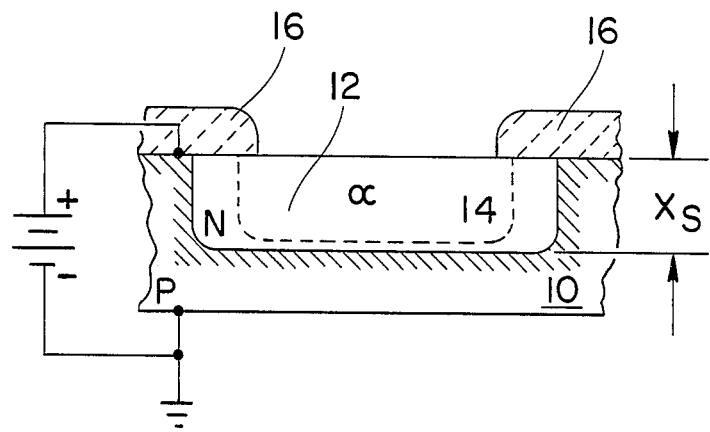
FIGS. 1A and 1B are cross-sectional views of an electrical programmable element formed in the surface of a doped region of a semiconductor body in accordance with prior art.
Figure 1B:
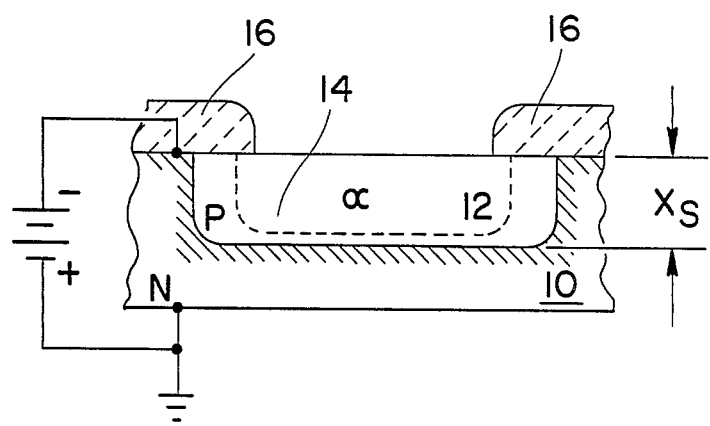

Referring now to the drawing, FIGS. 1A and 1B are cross-sectional views of electrically-programmable elements formed in the surface of a doped region in accordance with prior art. The two embodiments are similar, and like elements have the same reference numerals. However, the dopant conductivity types are reversed in the two embodiments.

A doped semiconductor body 10 of one conductivity type has a doped region 12 of opposite conductivity type formed therein abutting a surface of the body 10. The P-N junction between the body 10 and the region 12 is reverse-biased as indicated to electrically isolate region 12 from the body 10. An amorphotized surface layer 14 is then formed in the region 12 by the shallow implantation of ions through a window in oxide layer 16. The ions forming the amorphotized region 14 have the same conductivity type as the region 12, i.e., in FIG. 1A, N-type dopants such as phosphorus and arsenic are implanted, whereas in FIG. 1B, P-type dopants such as boron are implanted, as taught in U.S. Pat. No. 4,590,589, supra. The resulting resistance of the implanted surface region can be on the order of $8 \times 10^7$ ohms as compared to 500 ohms resistance of the region 12. However, the resistance of the surface region 14 can be reduced to the order of 500 ohms by applying a programming voltage on the order of 12 volts thereacross, thereby crystallizing part of the amorphotized region 14.

As device dimensions are scaled to smaller geometries, the lateral diffusion of dopants must reduce accordingly. Since the lateral diffusion is directly related to the vertical depth of the junction between regions 10 and 12, $X_j$, the ion implantation forming the surface layer 14 comes closer to the P-N junction. For example, in a 1.2 micron CMOS technology, $X_j$ is typically 0.3 micron, and the thickness of the amorphotized layer 14 for an implant at 60 Kev is 0.18 micron. The crystal damage induced by the amorphotizing implant can propagate to the underlying P-N junction and result in unwanted current leakage when the junction is reverse-biased.

Figure 2A:
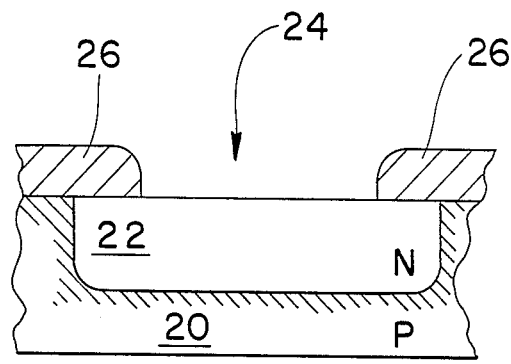
FIGS. 2A-2C are cross-sectional views illustrating the fabrication of an electrically-programmable element in accordance with one embodiment of the present invention.
Figure 2B:
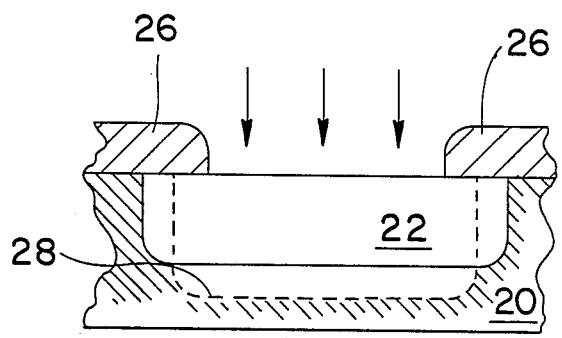
Figure 2C:
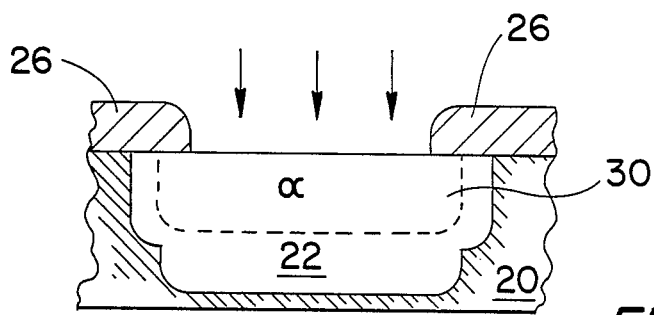

FIGS. 2A-2C are cross-sectional views illustrating the fabrication of an electrically-programmable element in a junction-isolated semiconductor region in accordance with the present invention. In FIG. 2A a P-type semiconductor body 20 has an N-type doped region 22 formed therein by the introduction of dopants through window 24 in a semiconductor layer 26 on the surface of body 20. The conductivity type could be reversed, as described above with reference to FIGS. 1A and 1B.

Prior to forming the amorphotized surface layer, N-type ions are implanted below the P-N junction between regions 20 and 22 as indicated by the dotted line 28 in FIG. 2B. The structure is subsequently annealed, thereby activating the ions and in effect extending the doped region 22 deeper into the body 20 as illustrated in FIG. 2C. Alternatively, diffusion can be used rather than implantation in forming the plug. Further, the plug can be created after the opening is etched into the top insulating film and prior to forming region 22.

Thereafter, ions are implanted in a shallow surface region forming the amorphotized surface layer 30 as shown in FIG. 2C. Advantageously, by increasing the depth of the P-N junction between the body 20 and the doped region 22 immediately beneath the amorphotized surface layer 30, the ion implantation used in forming the amorphotized layer 30 will not interfere with the P-N junction between the body 20 and the region 22. For a 1.2 micron CMOS technology where $X_j$ is typically 0.3 micron and the amorphotized layer thickness is 0.18 micron, the plug depth should be 0.5-1.0 micron.

The process in accordance with the present invention facilitates the fabrication of electrically-programmable elements in high-density integrated circuits. While the invention has been described with reference to a specific embodiment, the description is illustrative of the invention and is not to be construed as limiting the invention. For example, the plug can be formed by a combination of an implant and diffusion, or by either alone. If an implant is used, it may not be necessary to add a diffusion step; however, an implant annealing cycle will be required. Alternatively, the appropriate dopant can be introduced via a gaseous, liquid or solid source and driven in during high-temperature cycling. Following formation of the plug, the amorphotizing implant is carried out. Various modifications and applications may occur to those skilled in the art without departing from the true spirit and scope of the invention as defined by the appended claims.

We claim:

1. A method of fabricating an electrically programmable element in a region of one conductivity type formed in a semiconductor body of opposite conductivity type comprising the steps of:

introducing dopants of said one conductivity type into said semiconductor body through said region and thereby extending the depth of at least a portion of said region into said body, and forming an amorphotized layer in said region above said portion of said region.

2. The method of fabricating an electrically programmable element as defined by claim 1 wherein said step for forming an amorphotized layer includes implanting dopants of said one conductivity type in said layer of said region.

3. The method of fabricating an electrically programmable element as defined by claim 2 wherein said step of introducing dopants includes implanting ions of said one conductivity type through said region into said semiconductor body and then annealing said semiconductor body.

4. The method of fabricating an electrically programmable element as defined by claim 2 wherein said step of introducing dopants includes applying a dopant of said one conductivity type to said region and then driving said dopant through said region into said body.

5. The method of fabricating an electrically programmable element as defined by claim 4 wherein said step of introducing dopants further includes implanting ions of said one conductivity type through said region into said semiconductor body and then annealing said semiconductor body.

* * * * *